(12) United States Patent
Barakatain et al.

(10) Patent No.: US 12,101,101 B2
(45) Date of Patent: Sep. 24, 2024

(54) ZIPPER CODE FRAMEWORK-BASED COMMUNICATION SYSTEMS AND METHODS

(71) Applicant: HUAWEI TECHNOLOGIES CO., LTD., Guangdong (CN)

(72) Inventors: Masoud Barakatain, Toronto (CA); Hamid Ebrahimzad, Ottawa (CA); Yoones Hashemi Toroghi, Stittsville (CA); Bashirreza Karimi, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/973,574

(22) Filed: Oct. 26, 2022

(65) Prior Publication Data

US 2024/0146332 A1 May 2, 2024

(51) Int. Cl.
*H03M 13/15* (2006.01)
*H04L 1/00* (2006.01)

(52) U.S. Cl.
CPC ...... *H03M 13/1515* (2013.01); *H04L 1/0041* (2013.01); *H04L 1/0075* (2013.01)

(58) Field of Classification Search
CPC .......... H03M 13/15; H03M 13/1515; H03M 13/253; H03M 13/2906; H04L 1/0041; H04L 1/0045; H04L 1/0061; H04L 1/0075
See application file for complete search history.

(56) References Cited

U.S. PATENT DOCUMENTS

2020/0177307 A1* 6/2020 Pan .................. H04L 1/0045
2023/0072039 A1 3/2023 Karimi et al.

FOREIGN PATENT DOCUMENTS

CN 114513214 A * 5/2022 ........ H03M 13/2909
WO 2022033053 A1 2/2022

OTHER PUBLICATIONS

Sukmadji et al., Zipper codes, IEEE Journal of Lightwave Technology, vol. 40, No. 19, Oct. 1, pp. 6397 to 6407. (Year: 2022).*
Sukmadji et al., Zipper codes: Spatially-coupled product-like code with iterative algebraic decoding, IEEE, pp. 1 to 6. (Year: 2019).*
Huang et al., Dynamic Decoding of Zipper Codes, IEEE, pp. 1 to 3. (Year: 2021).*
Sukmadji et al., "Zipper codes: Spatially-coupled product-like codes with iterative algebraic decoding", Proc. 16th Can. Workshop Inf. Theory (CWIT), Jun. 2019, pp. 1-6.
Smith et al., "Staircase Codes: FEC for 100 Gb/s OTN", J. Lightw. Technol., vol. 30, No. 1, Jan. 1, 2012, pp. 110-117.

(Continued)

*Primary Examiner* — Shelly A Chase
(74) *Attorney, Agent, or Firm* — BCF LLP (57) ABSTRACT

Disclosed are systems and methods for transmission and reception of data bits. A plurality of data bits are received. FEC-based encoded data bits are generated in accordance with a zipper code framework incorporating component non-binary codes. The zipper code framework includes a buffer having a virtual buffer and a real buffer. Codewords associated with the FEC-based encoded data bits are stored in rows of the real buffer. A given codeword in a given row of the real buffer is mapped to different rows of the virtual buffer in a quasi-diagonal interleaving manner.

30 Claims, 6 Drawing Sheets

(56) References Cited

OTHER PUBLICATIONS

Feltstrom et al., "Braided Block Codes", IEEE Trans. Inf. Theory, vol. 55, No. 6, Jun. 2009, pp. 2640-2658.
International Search Report issued from the China National Intellectual Property Administration on Dec. 20, 2023 in connection with the corresponding International Application PCT/CN2023/123116.

* cited by examiner

ZIPPER CODE FRAMEWORK-BASED COMMUNICATION SYSTEMS AND METHODS

CROSS-REFERENCE TO RELATED APPLICATIONS

This is the first application filed for the instantly disclosed technology.

TECHNICAL FIELD

The present disclosure generally relates to digital communications and, in particular, to zipper code framework-based communication systems and methods.

BACKGROUND

Recently, fiber-optical communication systems have been deployed, from data center interconnections to cellular network backhauls and to transcontinental submarine systems. In modern high-throughput optical communication systems, forward error correction (FEC) is a crucial technique for protecting the data against the channel noise and inherent system impairments. However, FEC techniques are often power-hungry and may contribute to over a sustainable amount (for example over 30%) of the total power consumed by the transceiver chips. Due to complexity constraints at high data throughputs, FEC schemes with hard-decision decoding are of significant interest for fiber-optical communication systems.

Typically, zipper codes-based frameworks have been used for describing spatially coupled product-like codes such as staircase codes and braided block codes. Conventionally, zipper codes are built with algebraic Bose-Chaudhuri-Hocquenghem (BCH) component codes and are decoded by decoding each component binary code iteratively.

The issue with the conventional frameworks is when the higher order modulation is used, which is usually the case in modern high-throughput systems, a multi-level coding or a bit-interleaved coded modulation scheme is used. When conventional zipper codes are used with a higher order modulation and in a concatenated coding scheme, a better performance is typically obtained with an ultra-low overhead (OH) zipper code, around 1.5-2.5%. However, the required decoding memory at such low OHs is too large for zipper codes, making the implementation complicated. Moreover, as a stand-alone solution, a conventional zipper code solution with binary BCH component code would have an inherent performance loss due to sub-optimality of considering symbols as uncorrelated bits.

With this said, there is an interest in developing an efficient zipper codes-based framework for a communication system.

SUMMARY

In general, zipper codes-based frameworks have been used for describing spatially coupled product-like codes such as staircase codes and braided block codes. The issue with the conventional frameworks is when the higher order modulation is used, which is usually the case in modern high-throughput systems, a multi-level coding or a bit-interleaved coded modulation scheme is used.

To this end, zipper code framework-based communication systems and methods that rely on component non-binary codes have been devised by the developers of the present technology. The zipper code framework as devised in the present technology may be blind to the inter dependency of the symbols. Such a zipper code framework may further reduce the error-floor issue that may arise with the increasing coupling factor in the quasi-diagonal interleaver mapping. Moreover, because of the use of RS component codes in various non-limiting embodiments, the obtained zipper code framework may have a high tolerance against burst errors.

In accordance with a first broad aspect of the present disclosure, there is provided a transmitter comprising: a forward error correction (FEC)-based encoder configured to: receive a plurality of data bits, and generate FEC-based encoded data bits in accordance with a zipper code framework incorporating component non-binary codes, wherein: the zipper code framework includes a buffer having a virtual buffer and a real buffer, and the FEC-based encoder stores codewords associated with the FEC-based encoded bits in rows of the real buffer; and map a given codeword in a given row of the real buffer to different rows of the virtual buffer.

In accordance with any embodiments of the present disclosure, the non-binary codes are Reed-Solomon codes.

In accordance with any embodiments of the present disclosure, the FEC-based encoder is further configured to: map the given codeword in the given row of the real buffer to different rows of the virtual buffer in a quasi-diagonal interleaving manner; select at least a first group of bits from the given codeword stored in the given row of the real buffer and copy the first group of bits in a first row of the virtual buffer such that the first row of the virtual buffer is diagonally adjacent to the given row of the real buffer; and select at least a second group of bits from the given codeword stored in the given row of the real buffer and copy the second group of bits in a second row of the virtual buffer adjacent to the first row such that the second group of bits is diagonal to the first group of bits.

In accordance with any embodiments of the present disclosure, a length of the first group of bits is equal to a length of the second group of bits.

In accordance with any embodiments of the present disclosure, the first group of bits belongs to a same non-binary code symbol.

In accordance with any embodiments of the present disclosure, the second group of bits belongs to a same non-binary code symbol.

In accordance with any embodiments of the present disclosure, the transmitter further comprises a transmitter processor configured to: process the FEC-based encoded data bits and generate an analog signal; and transmit the analog signal to a communication channel.

In accordance with a second broad aspect of the present disclosure, there is provided a receiver comprising: a receiver processor configured to: receive an analog signal transmitted by a transmitter, process the received analog signal and generate received forward error correction (FEC)-based encoded bits in accordance with a zipper code framework that incorporates component non-binary codes; and a FEC-based decoder configured to decode the received FEC-based encoded bits in accordance with a non-binary decoding technique and generate information bits.

In accordance with any embodiments of the present disclosure, the non-binary codes are Reed-Solomon codes.

In accordance with any embodiments of the present disclosure, the FEC-based decoder is further configured to store codewords associated with the received FEC-based encoded bits in rows of a real buffer associated with the zipper code framework.

In accordance with any embodiments of the present disclosure, the FEC-based decoder is further configured to: select at least a first group of bits from a given codeword stored in a given row of the real buffer and copy the first group of bits in a first row of a virtual buffer associated with the zipper code framework such that the first row of the virtual buffer is diagonally adjacent to the given row of the real buffer; and select at least a second group of bits from the given codeword stored in the given row of the real buffer and copy the second group of bits in a second row of the virtual buffer adjacent to the first row such that the second group of bits is diagonal to the first group of bits.

In accordance with any embodiments of the present disclosure, the FEC-based decoder is further configured to select the first group of bits and the second group of bits in accordance with an interleaver map.

In accordance with any embodiments of the present disclosure, the receiver further comprises a de-mapper configured to compute absolute values of log-likelihood ratios (LLRs) from the received FEC-based encoded bits.

In accordance with any embodiments of the present disclosure the FEC-based decoder is further configured to: determine erasure bits in the received FEC-based encoded bits based on the absolute values of LLRs less than a predefined threshold; determine reliable bits in the received FEC-based encoded bits based on the absolute values of LLRs more than the predefined threshold; decode a given codeword associated with the received FEC-based encoded bits by one or more of: marking symbols with erasure bits in the given codeword associated with the received FEC-based encoded bits as erased symbols and decoding the given codeword using error-and-erasure, decoding the given codeword based on the absolute values of LLRs associated with the FEC-based encoded bits, and flipping the erasure bits and decoding the given codeword using the flipped erasure bits and the reliable bits.

In accordance with any embodiments of the present disclosure the FEC-based decoder is further configured to: determine if more one valid codeword is decoded corresponding to the given codeword, in the event if more than one valid codeword is decoded, select the codeword in which least number of reliable bits are flipped and remove erasure marking for remaining iterations of decoding.

In accordance with any embodiments of the present disclosure, the FEC-based decoder is further configured to: determine if only one valid codeword is decoded corresponding to the given codeword, in the event if only one valid codeword is decoded, remove erasure marking for remaining iterations of decoding.

In accordance with any embodiments of the present disclosure, the FEC-based decoder is further configured to: determine if no valid codeword is decoded corresponding to the given codeword, in the event if no valid codeword is decoded, perform no decoding operation on the given codeword.

In accordance with a third broad aspect of the present disclosure, there is provided a method of transmission comprising: receiving a plurality of data bits; generating FEC-based encoded data bits in accordance with a zipper code framework incorporating component non-binary codes, wherein the zipper code framework including a buffer having a virtual buffer and a real buffer; storing codewords associated with the FEC-based encoded bits in rows of the real buffer; and mapping a given codeword in a given row of the real buffer to different rows of the virtual buffer.

In accordance with any embodiments of the present disclosure, the method for transmission further comprises: mapping the given codeword in the given row of the real buffer to different rows of the virtual buffer in a quasi-diagonal interleaving manner; selecting at least a first group of bits from the given codeword stored in the given row of the real buffer and copying the first group of bits in a first row of the virtual buffer such that the first row of the virtual buffer is diagonally adjacent to the given row of the real buffer; and selecting at least a second group of bits from the given codeword stored in the given row of the real buffer and copying the second group of bits in a second row of the virtual buffer adjacent to the first row such that the second group of bits is diagonal to the first group of bits.

In accordance with any embodiments of the present disclosure, the method for transmission further comprises: processing the FEC-based encoded data bits and generating an analog signal; and transmitting the analog signal to a communication channel.

In accordance with a fourth broad aspect of the present disclosure, there is provided a method for reception comprising: receiving an analog signal transmitted by a transmitter; processing the received analog signal and generating received forward error correction (FEC)-based encoded bits in accordance with a zipper code framework that incorporates component non-binary codes; and decoding the received FEC-based encoded bits in accordance with a non-binary decoding technique and generating information bits.

In accordance with any embodiments of the present disclosure, the method of reception further comprises storing codewords associated with the received FEC-based encoded bits in rows of a real buffer associated with the zipper code framework.

In accordance with any embodiments of the present disclosure, the method of reception further comprises: selecting at least a first group of bits from a given codeword stored in a given row of the real buffer and copying the first group of bits in a first row of a virtual buffer associated with the zipper code framework such that the first row of the virtual buffer is diagonally adjacent to the given row of the real buffer; and selecting at least a second group of bits from the given codeword stored in the given row of the real buffer and copying the second group of bits in a second row of the virtual buffer adjacent to the first row such that the second group of bits is diagonal to the first group of bits.

In accordance with any embodiments of the present disclosure, the method of reception further comprises selecting the first group of bits and the second group of bits in accordance with an interleaver map.

In accordance with any embodiments of the present disclosure, the method of reception further comprises computing absolute values of log-likelihood ratios (LLRs) from the received FEC-based encoded bits.

In accordance with any embodiments of the present disclosure, the method of reception further comprises determining erasure bits in the received FEC-based encoded bits based on the absolute values of LLRs less than a predefined threshold; determining reliable bits in the received FEC-based encoded bits based on the absolute values of LLRs more than the predefined threshold; decoding a given codeword associated with the received FEC-based encoded bits by one or more of: marking symbols with erasure bits in the given codeword associated with the received FEC-based encoded bits as erased symbols and decoding the given codeword using error-and-erasure, decoding the given codeword based on the absolute values of LLRs associated with the FEC-based encoded bits, and flipping the erasure bits and decoding the given codeword using the flipped erasure bits and the reliable bits.

In accordance with any embodiments of the present disclosure, the method of reception further comprises determining if more one valid codeword is decoded corresponding to the given codeword, in the event if more than one valid codeword is decoded, selecting the codeword in which least number of reliable bits are flipped and removing erasure marking for remaining iterations of decoding.

In accordance with any embodiments of the present disclosure, the method of reception further comprises determining if only one valid codeword is decoded corresponding to the given codeword, in the event if only one valid codeword is decoded, removing erasure marking for remaining iterations of decoding.

In accordance with any embodiments of the present disclosure the method of reception further comprises determining if no valid codeword is decoded corresponding to the given codeword, in the event if no valid codeword is decoded, performing no decoding operation on the given codeword.

BRIEF DESCRIPTION OF THE FIGURES

Further features and advantages of the present disclosure will become apparent from the following detailed description, taken in combination with the appended drawings, in which.

It is to be understood that throughout the appended drawings and corresponding descriptions, like features are identified by like reference characters. Furthermore, it is also to be understood that the drawings and ensuing descriptions are intended for illustrative purposes only and that such disclosures do not provide a limitation on the scope of the claims.

DETAILED DESCRIPTION

The instant disclosure is directed to address at least some of the deficiencies of the current technology. In particular, the instant disclosure describes zipper code framework-based communication systems and methods.

Unless otherwise defined or indicated by context, all technical and scientific terms used herein have the same meaning as commonly understood by one of ordinary skill in the art to which the described embodiments appertain to.

In the context of the present specification, unless provided expressly otherwise, the words "first", "second", "third", etc. have been used as adjectives only for the purpose of allowing for distinction between the nouns that they modify from one another, and not for the purpose of describing any particular relationship between those nouns. Thus, for example, it should be understood that, the use of the terms "first processor" and "third processor" is not intended to imply any particular order, type, chronology, hierarchy or ranking (for example) of/between the processor, nor is their use (by itself) intended to imply that any "second processor" must necessarily exist in any given situation. Further, as is discussed herein in other contexts, reference to a "first" element and a "second" element does not preclude the two elements from being the same actual real-world element. Thus, for example, in some instances, a "first" processor and a "second" processor may be the same software and/or hardware, in other cases they may be different software and/or hardware.

It will be understood that when an element is referred to as being "connected" or "coupled" to another element, it can be directly or indirectly connected or coupled to the other element or intervening elements that may be present. In contrast, when an element is referred to as being "directly connected" or "directly coupled" to another element, there are no intervening elements present. Other words used to describe the relationship between elements should be interpreted in alike fashion (e.g., "between" versus "directly between," "adjacent" versus "directly adjacent," etc.).

In the context of the present specification, when an element is referred to as being "associated with" another element, in certain embodiments, the two elements can be directly or indirectly linked, related, connected, coupled, the second element employs the first element, or the like without limiting the scope of present disclosure.

The terminology used herein is only intended to describe particular representative embodiments and is not intended to be limiting of the present technology. As used herein, the singular forms "a," "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

The examples and conditional language recited herein are principally intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudocode, and the like represent various processes which may be substantially represented in computer-readable media and so executed by a computer or processor, whether or not such computer or processor is explicitly shown.

The functions of the various elements shown in the figures, including any functional block labeled as a "processor" or a "processing unit", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general-purpose processor, such as a central processing unit (CPU) or a processor dedicated to a specific purpose, such as a graphics processing unit (GPU). Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

In the context of the present disclosure, the expression "data" includes data of any nature or kind whatsoever capable of being stored in a database. Thus, data includes, but is not limited to, audiovisual works (images, movies, sound records, presentations etc.), data (location data, numerical data, etc.), text (opinions, comments, questions, messages, etc.), documents, spreadsheets, etc.

Software modules, modules, or units which are implied to be software, may be represented herein as any combination of flowchart elements or other elements indicating performance of process steps and/or textual description. Such modules may be executed by hardware that is expressly or implicitly shown.

With these fundamentals in place, the instant disclosure is directed to address at least some of the deficiencies of the current technology. In particular, the instant disclosure describes zipper code framework-based communication systems and methods.

Figure 1:
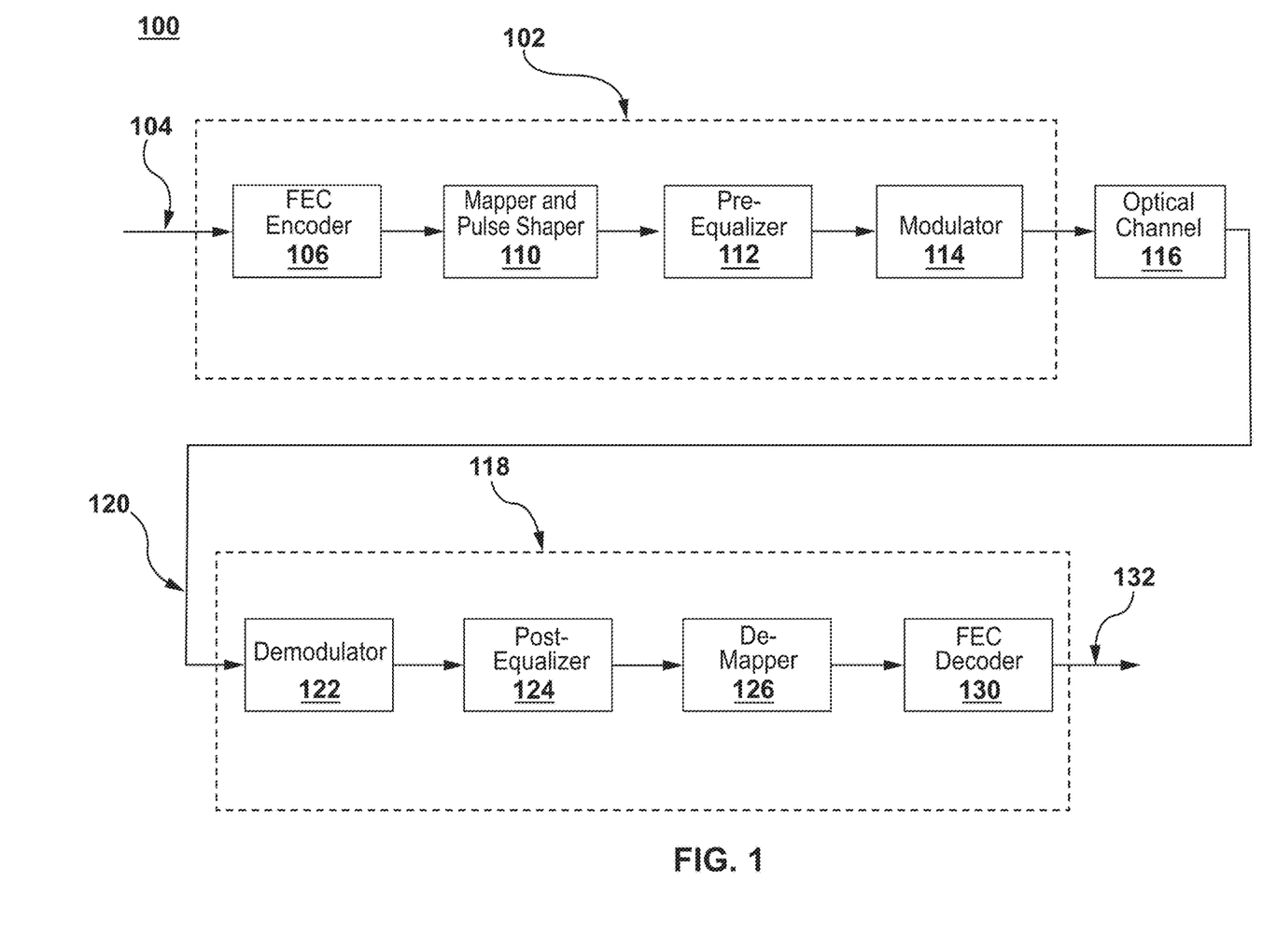
FIG. 1 illustrates a high-level functional block diagram of a communication system 100 using forward error correction technique, in accordance with various non-limiting embodiments of the present disclosure.

FIG. 1 illustrates a high-level functional block diagram of a communication system 100 using forward error correction (FEC) technique, in accordance with various non-limiting embodiments of the present disclosure. As shown, the communication system 100 may include a transmitter 102 and a receiver 118. The transmitter 102 may include a FEC encoder 106, a mapper and pulse shaper 110, a pre-equalizer 112, and a modulator 114. The receiver 118 may include a demodulator 122, a post-equalizer 124, a de-mapper 126, and a FEC decoder 130. It is to be noted that the communication system 100 may include other components however such components have been omitted from FIG. 1. The communication system 100 may be an optical communication system, wired communication system or a wireless communication system. The use of the terms "transmitter" or "receiver" may refer to any type of transmitter or receiver using FEC.

In certain non-limiting embodiments, at the transmitter 102, the FEC encoder 106 may receive a digital data signal comprising a plurality of data bits 104 (i.e., information bits) and generate FEC-based encoded bits. The FEC encoder 106 may generate the FEC-based encoded bits in accordance with a zipper code framework incorporating component non-binary codes, the zipper code framework including a buffer having a virtual buffer and a real buffer (details of which will be discussed later in the disclosure).

It is to be noted that a total number of FEC-based encoded bits Lc may be typically greater than the total number of data bits Li. The quantity (Lc−Li)/Li may be referred to as overhead (OH) of the FEC encoder 106, also the quantity r=Li/Lc may be referred to as the code rate of the FEC encoder 106.

The FEC-encoder 106 may rearrange the FEC-based encoded bits to generate rearranged FEC-based encoded bits. The FEC-encoder 106 may shuffle the FEC-based encoded bits in a predefined manner.

Figure 2:
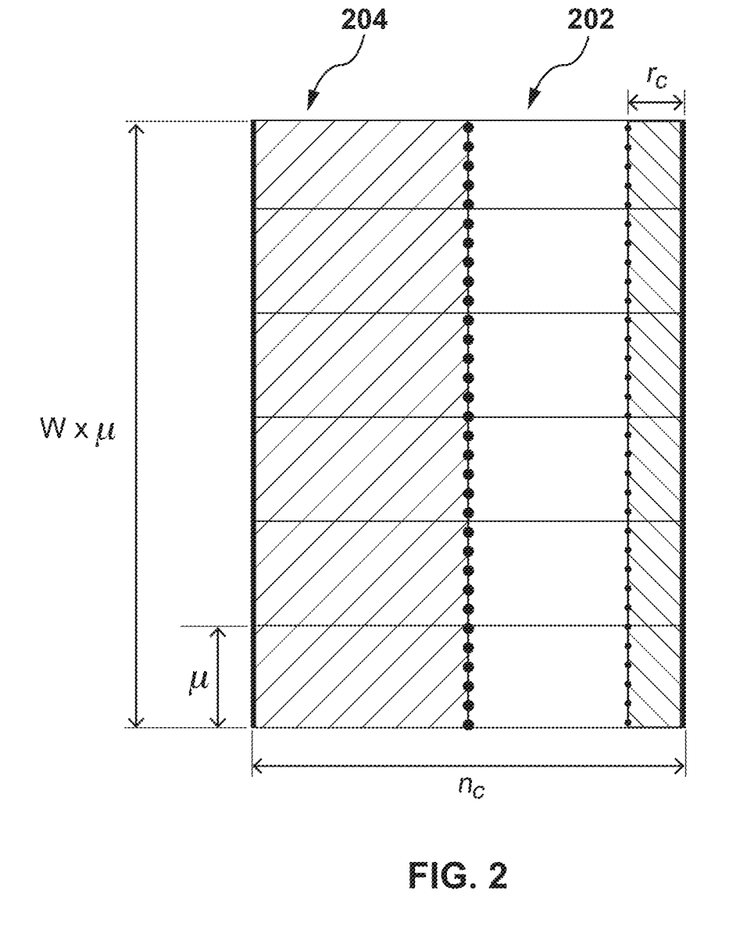
FIG. 2 illustrates a representative example of the zipper code framework, in accordance with various non-limiting embodiments of the present disclosure.

In certain non-limiting embodiments, the encoding methods performed by the FEC encoder 106 may be based on a zipper code framework. FIG. 2 illustrates a representative example of the zipper code framework 200, in accordance with various non-limiting embodiments of the present disclosure. The zipper code framework 200 may include a real buffer 202 and a virtual buffer 204. The real buffer 202 and virtual buffer 204 may include a plurality of rows. On each row a codeword associated with the FEC-based encoded bits may be stored. The total length of the real buffer 202 and virtual buffer 204 may be represented as $n_c$. Also, the codeword associated with the FEC-based encoded bits may include redundant bits $r_c$ added to the information bits 104. The redundant bits $r_c$ may assist the FEC decoder 130 (as shown in FIG. 1) for decoding purposes. In one non-limiting example of the redundant bits $r_c$ may represent parity of the information bits 104.

In certain non-limiting embodiments, component codes associated with the zipper code framework 200 may be non-binary codes. One example of such non-binary codes may include Reed-Solomon (RS) codes.

Referring to FIG. 1, the FEC encoder 106 may encode the plurality of data bits 104 in accordance with RS codes and generate FEC-based encoded bits. The FEC encoder 106 may store the codewords associated with the FEC-based encoded bits in rows of the real buffer 202.

In certain non-limiting embodiments, the FEC-encoder 106 may have access to the real buffer 202 and the virtual buffer 204. The FEC-encoder 106 may be configured to map a given codeword, for example the codeword 301 located in the row 308, in the real buffer 202 to different row, for example, rows 310, 312, and 314 of the virtual buffer 204.

Figure 3:
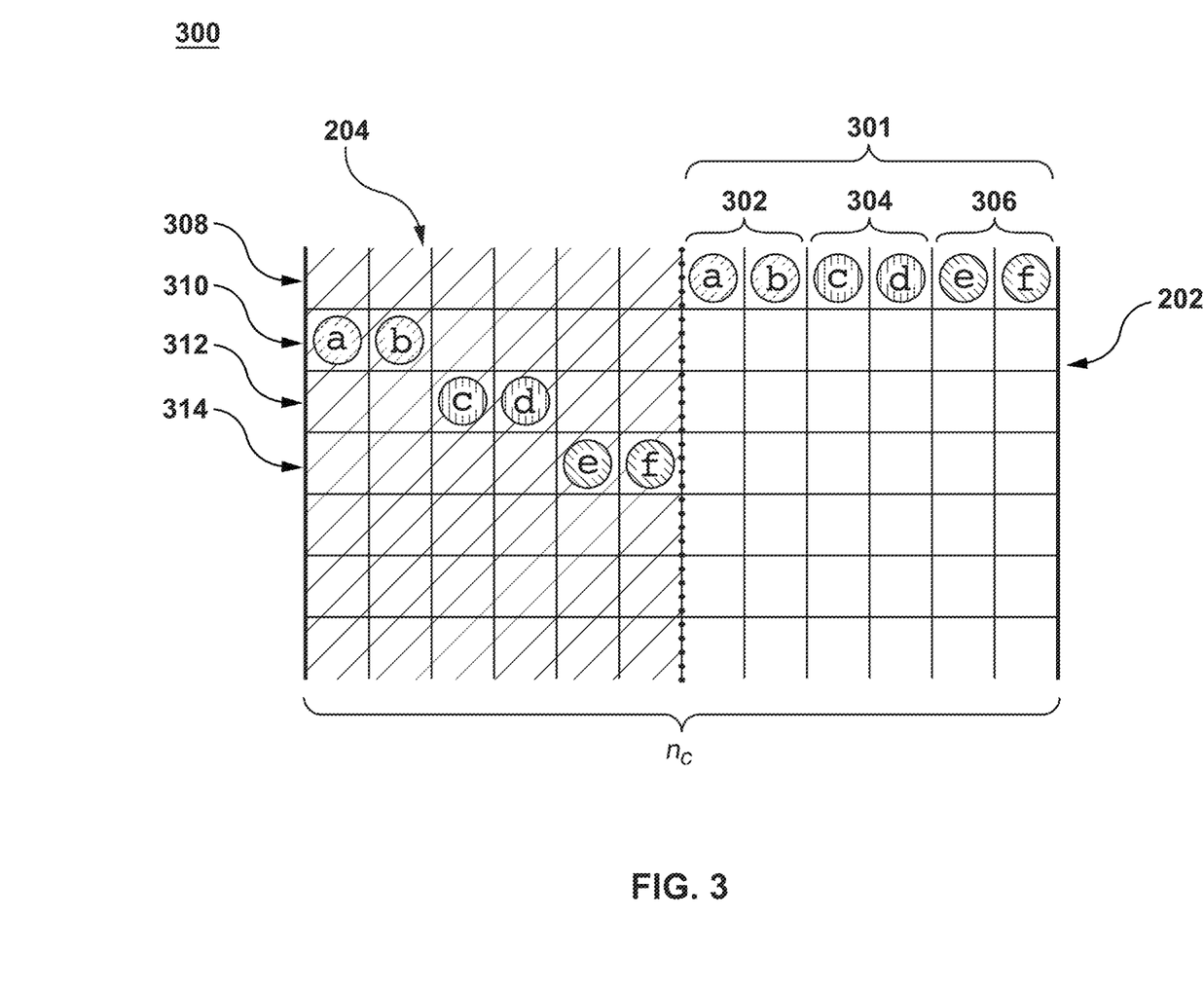
FIG. 3 illustrates mapping of a given codeword in a given row of a real buffer to different rows of a virtual buffer.

FIG. 3 illustrates mapping 300 of a given codeword in a given row of the real buffer 202 to different rows of the virtual buffer 204. As shown, in this example, a codeword 301 (including the redundant bits $r_c$) associated with the FEC-based encoded bits may be stored in a row 308 of the real buffer 202. The FEC-encoder 106 may perform interleaving in a quasi-diagonal manner and may select a first group of bits 302 from the codeword 301 stored in the row 308 of the real buffer 202 and copy the first group of bits 302 to a row 310 of the virtual buffer 204. The row 308 and the row 310 may be diagonally adjacent to each other. The FEC-encoder 106 may select a second group of bits 304 from the codeword 301 stored in the row 308 and copy the second group of bits 304 to a row 312 of the virtual buffer 204. The row 312 may be adjacent to the row 310. Also, the first group of bits 302 copied to the virtual buffer 204 may be located diagonally to the second group of bits 304 copied to the virtual buffer 204.

In a similar manner, the FEC-encoder 106 may select a third group of bits 306 from the codeword 301 stored in the row 308 and copy the third group of bits 306 to a row 314 of the virtual buffer 204. The row 314 may be adjacent to the row 312. Also, the first group of bits 302, the second group of bits 304 and the third group of bits 306 copied to the virtual buffer 204 may be located diagonally to each other. It is to be noted that the codewords in each given row for example, 308, 310, 312, and 314 may be referred to as component non-binary codewords.

In certain non-limiting embodiments, the first group of bits 302, the second group of bits 304 and the third group of bits 306 may have same length. Moreover, each one of the first group of bits 302, the second group of bits 304 and the third group of bits 306 may belong to the respective non-binary code symbols. For example, the first group of bits 302 may belong to a first symbol in the codeword 301, the second group of bits 304 may belong to a second symbol in the codeword 301 and the third group of bits 306 may belong to a third symbol in the codeword 301.

In general, the FEC-encoder 106 may allow grouping of up to c bits in the codeword 301 to be copied from the row 308 of the real buffer 202 to the rows 310, 312, and 314 in a diagonal manner. In so doing, a duration of the interleaving may be reduced by a factor c. In other words, without grouping of the bits, a number of rows required in the virtual buffer 204 may be significantly increased.

The mapping performed by FEC-encoder 106 is a significant component of the zipper code framework 200 that directly affects the code performance and memory requirement at the FEC decoder 130. By way of example (referring to FIG. 3), a zipper code framework with $n_c$=12 and coupling factor c=2, the interleaving period for the quasi-diagonal interleaver map is 3, thereby, memory requirements at the FEC decoder 130 is significantly reduced as compared to the interleaving period for a diagonal interleaver without any grouping on the bits.

It is to be noted, by virtue of using RS codes as the component codes in the zipper code framework 200 and grouping bits belonging to the same RS code symbol, the zipper code framework 200 may be blind to the inter dependency of the symbols. Such zipper code framework 200 may further reduce the error-floor issue that may arise with the increasing coupling factor c in the quasi-diagonal interleaver mapping. Moreover, because of the use of RS component codes, the obtained zipper code framework 200 may have a high tolerance against burst errors.

The FEC-encoder 106 may provide the FEC-based encoded bits to the mapper and pulse shaper 110. The mapper and pulse shaper 110 may apply a suitable mapping technique to translate the FEC-based encoded bits to discrete constellation points, according to suitable constellation label design. The mapper and pulse shaper 110 may convert the constellation points to digital pulses according to any suitable pre-defined pulse-shaping function, thereby generating a digital electrical signal.

The mapper and pulse shaper 110 may provide the digital electrical signal to the pre-equalizer 112. In certain non-limiting embodiments, the pre-equalizer 112 may be optionally used on the transmitter side to compensate for some of the channel distortions, thereby generating an equalized digital electrical signal from the digital electrical signal, which may be modulated into an analog optical signal by the modulator 114. In certain non-limiting embodiments, the mapper and pulse shaper 110, pre-equalizer 112, and the modulator 114 may be referred to as a transmitter processor.

The transmitter 102 may transmit the optical signal through an optical channel 116 such as a fiber-optic channel. In certain non-limiting embodiments, an interleaver map may be predefined in the transmitter 102 and the receiver 118. The interleaver map may assist the receiver 118 to fill a receiver virtual buffer in a similar manner as the virtual buffer 204 has been filled.

The analog optical signal 120 may be received by the receiver 118 from the optical channel 116. The demodulator 122 may demodulate the received analog optical signal 120 to a received digital signal. The post-equalizer 124 may equalize the received digital signal and may generate an equalized digital signal. The post-equalization process may compensate for the channel distortions. In certain non-limiting embodiments, the demodulator 112 and the post-equalizer 124 may be referred to as a receiver processor.

The de-mapper 126 may translate the equalized digital signal back to a bit sequence, which manifests the FEC-based encoded bits in the transmitter 102. The bit sequence may have errors introduced from the optical channel 116. This bit sequence may be referred to in some examples as received FEC-based encoded bits.

In certain non-limiting embodiments, the FEC decoder 130 may be configured to store codewords associated with the received FEC-based encoded bits in rows of a receiver real buffer associated with the zipper code framework. It is to be noted that the receiver real buffer may be implemented similar to the real buffer 202 associated with the transmitter 102.

In certain non-limiting embodiments, the FEC decoder 130 may be configured to select at least a first group of bits from a given codeword stored in a given row of the receiver real buffer. The FEC decoder 130 may copy the first group of bits in a first row of a receiver virtual buffer associated with the zipper code framework. The receiver real buffer may be implemented similar to the virtual buffer 204 associated the transmitter 102. It is to be noted that the first row of the receiver virtual buffer may be diagonally adjacent to the given row of the receiver real buffer.

In certain non-limiting embodiments, the FEC decoder 130 may be configured to select at least a second group of bits from the given codeword stored in the given row of the receiver real buffer. The FEC decoder 130 may copy the second group of bits in a second row of the receiver virtual buffer. The second row may be adjacent to the first row such that the second group of bits is diagonal to the first group of bits.

In certain non-limiting embodiments, the FEC decoder 130 may select the first group of bits and the second group of bits in accordance with the interleaver map.

The FEC decoder 130 may perform decoding of the codewords in the receiver real buffer and the group of bits copied to the receiver virtual buffer in accordance with the non-binary decoding technique and generate information bits 132 manifesting information bits 104.

In certain non-limiting embodiments, the decoding techniques may be based on iterative window decoding. Zipper codes meanwhile provide flexibility in choosing the decoding window size W. The window size W may be referred number of rows the FEC decoder 130 may be processing in a given iteration. At each iteration, the FEC decoder 130 may decode the rows using the component decoder to decode the rows. In case, the FEC decoder 130 correct (or much less often, mis correct) any bits, the FEC decoder 130 may update their copies of the altered bits in the receiver virtual buffer as well accordingly. In certain non-limiting embodiments, the decoding may continue until a maximum number of predefined number of iterations is reached for a chunk. The FEC decoder 130 may then output the oldest chunk of bits in the decoding window and brings a newly received chunk of bits into the FEC decoder 130.

To further improve the performance of the zipper code framework 200 with RS component codes, in various non-limiting embodiments, the FEC decoder 130 may rely on error-and-erasure decoding of the component codes. To do so, the de-mapper 126 may compute log-likelihood ratios (LLRs) from the received FEC-based encoded bits. For a given bit, the LLR may be computed as:

$$LLR(y) = \ln \frac{P_{Y|X}(y|x=1)}{P_{Y|X}(y|x=0)} \quad (1)$$

The de-mapper 126 may provide the LLRs values associated with the received FEC-based encoded bits to the FEC decoder 130.

The FEC decoder 130 may be configured to determine erasure bits and reliable bits in the received FEC-based encoded bits. To make the selection, the FEC decoder 130 may rely on the LLR values of the received FEC-based encoded bits. A threshold value η on the LLR values may be predefined and based on the threshold value η, the FEC decoder 130 may determine erasure bits and reliable bits in the received FEC-based encoded bits. In certain non-limiting embodiments, if the absolute value of the LLR of a given bit is more than the threshold value η, the respective bit may be considered as highly reliable. On the other hand, if the absolute value of the LLR of a given bit is less than the threshold value η, the respective bit may be considered as an erasure bit. In certain non-limiting embodiments, the threshold value η may determine by simulation during design time of the communication system 100.

In certain non-limiting embodiments, the FEC encoder 130 may mark the symbols with the erasure bits in the codeword associated with the received FEC-based encoded bits as erased symbols. The FEC decoder 130 may perform error-and-erasure decoding based on the erased symbols.

In certain non-limiting embodiments, the FEC decoder 130 may perform decoding based on all of the LLR values of the bits associated with the given codeword. In this embodiment, the FEC decoder 130 may rely on the erasure bits as well as the reliable bits for decoding. The FEC decoder 130 may perform error-only decoding in this embodiment.

In certain non-limiting embodiments, the FEC decoder 130 may flip the erasure bits. For example, if the erasure bit is '0', the FEC decoder 130 may flip the value of erasure bit to '1'. In this embodiment, FEC decoder 130 may perform error-only decoding using the reliable bits and the flipped bits.

Based on the above decoding techniques, the FEC decoder 130 may determine if more than one valid codeword is decoded corresponding to the given codeword. In the event if more than one valid codeword is decoded, the FEC decoder 130 may select the codeword in which least number of reliable bits are flipped and remove erasure marking for remaining iterations of decoding.

In certain non-limiting embodiments, the FEC decoder 130 may determine if only one valid codeword is decoded corresponding to the given codeword. In the event if only one valid codeword is decoded, the FEC decoder 130 may remove erasure marking for remaining iterations of decoding.

In certain non-limiting embodiments, the FEC decoder 130 may determine if no valid codeword is decoded corresponding to the given codeword. In the event if no valid codeword is decoded, the FEC decoder 130 may perform no decoding operation on the given codeword.

Figure 4:
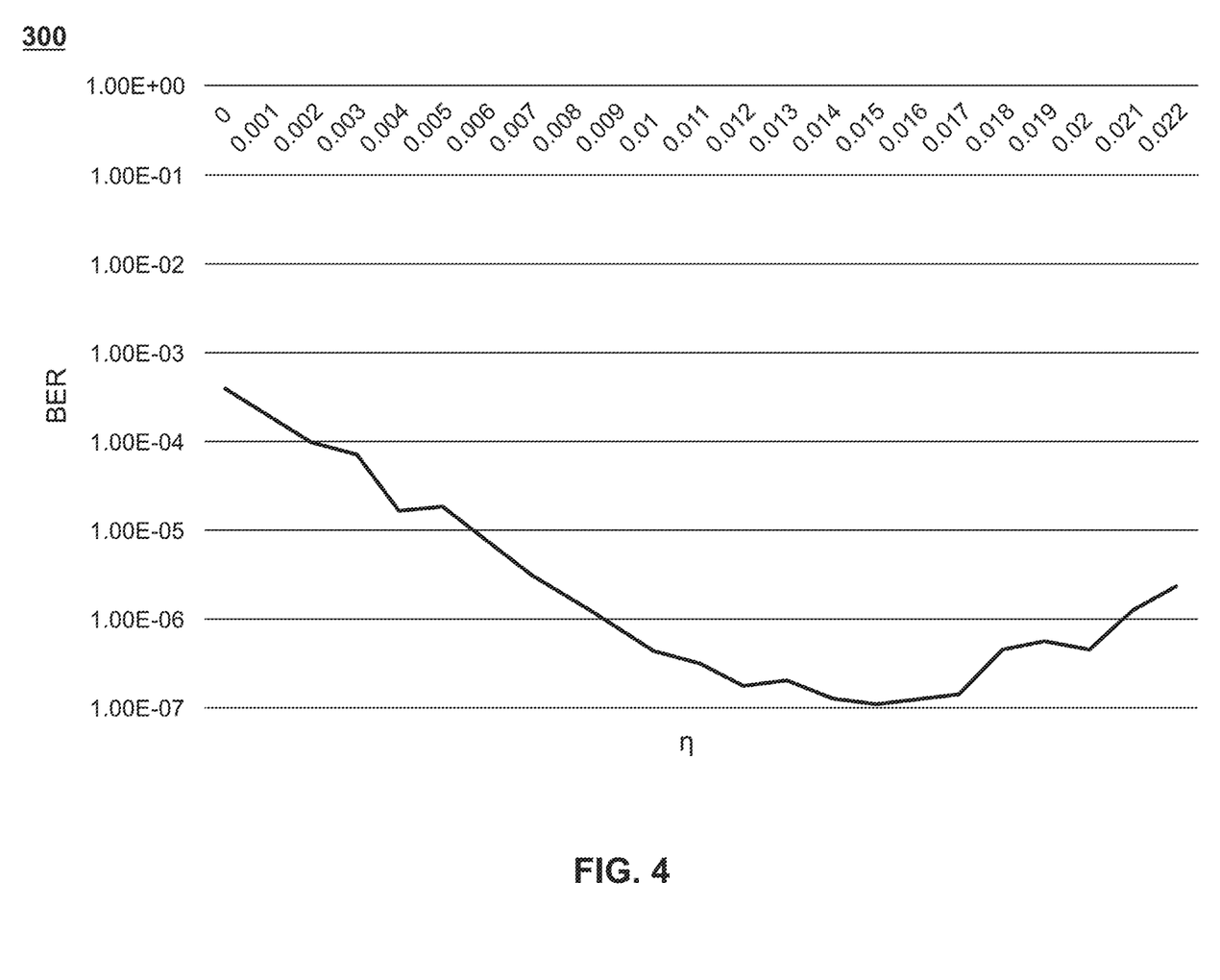
FIG. 4 illustrates benefit of using error-and-erasure-based decoding of zipper code framework, in accordance with various non-limiting embodiments of the present disclosure.

FIG. 4 illustrates benefit of using error-and-erasure-based decoding of zipper code framework 200, in accordance with various non-limiting embodiments of the present disclosure. At a fixed signal-to-noise ratio, by varying the threshold value η it is observed various non-limiting embodiments of the present disclosure may reduce the output BER by up to four orders of magnitude. This, in turn, translates to earlier start of the waterfall curve for zipper-RS codes.

Thus, by virtue of the zipper code framework 200 with RS component codes and the quasi-interleaver map, a decoding memory and latency at ultra-low OHs may be reduced. Additionally, a sharp waterfall performance curve with reduced error floors may be achieved which may be suitable for burst error correction. The error-and-erasure based decoding of the RS component codes further improves the zipper code performance.

Figure 5:
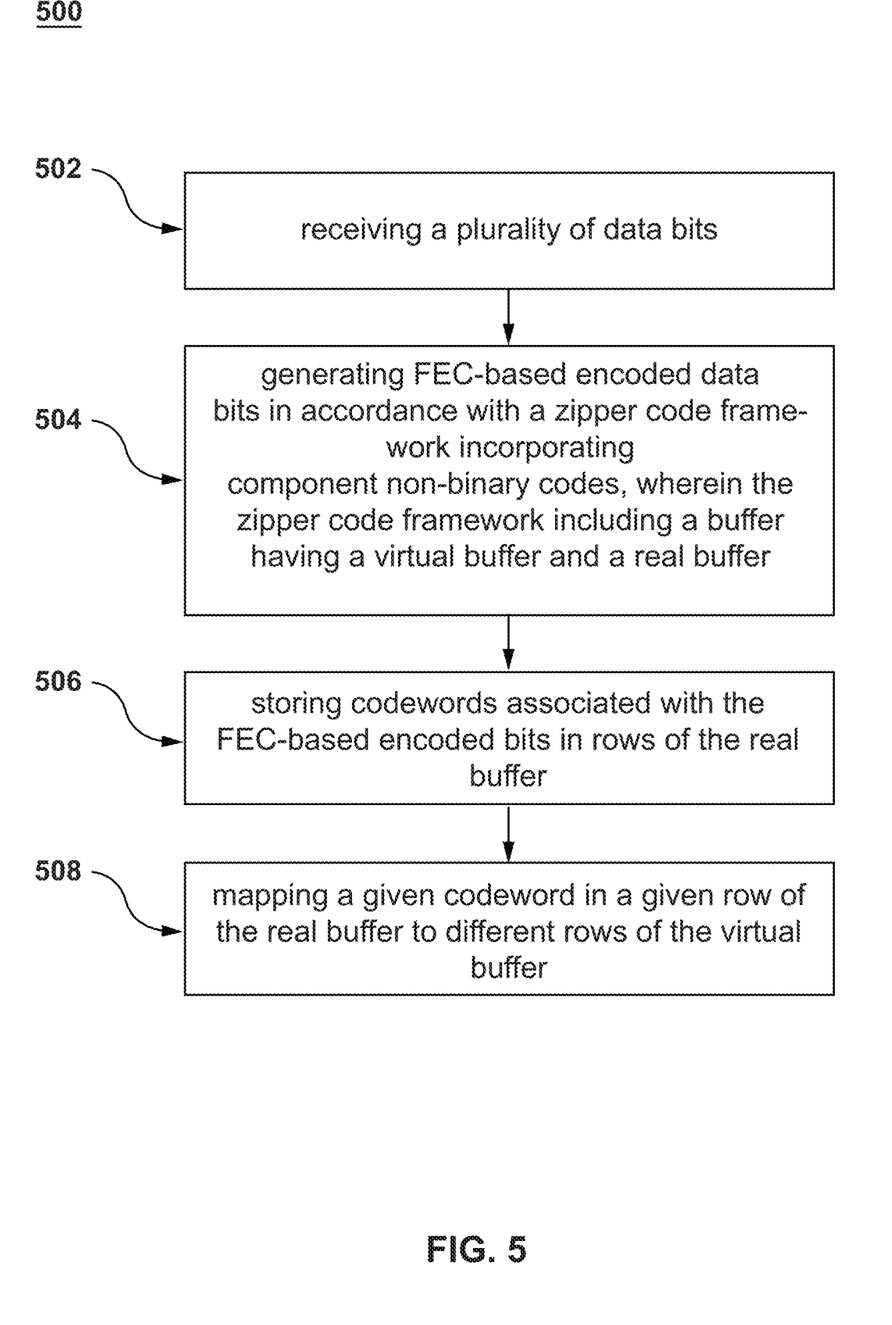
FIG. 5 illustrates a flowchart of a process implemented over the transmitter, in accordance with various non-limiting embodiments of the present disclosure.

FIG. 5 illustrates a flowchart of a process 500 implemented over the transmitter 102, in accordance with various non-limiting embodiments of the present disclosure. As shown, the process 500 commences at step 502 where the transmitter 102 receives a plurality of data bits. As previously noted, at the transmitter 102, the FEC encoder 106 may receive a digital data signal comprising a plurality of data bits 104 (i.e., information bits).

The process advances to step 504 where the transmitter 102 generates FEC-based encoded data bits in accordance with a zipper code framework incorporating component non-binary codes, wherein the zipper code framework including a buffer having a virtual buffer and a real buffer. As noted above, the FEC encoder 106 included in the transmitter 102 generates FEC-based encoded data bits in accordance with zipper code framework 200. The zipper code framework 200 may incorporate component non-binary codes such as RS codes. Also, the zipper code framework 200 may include the real buffer 202 and the virtual buffer 204.

The process 500 proceeds to step 506 where the transmitter 506 stores the codewords associated with the FEC-based encoded bits in rows of the real buffer. As noted above, The FEC encoder 106 stores the codewords associated with the FEC-based encoded bits in rows of the real buffer 202.

Finally, at step 508, the transmitter 506 maps the given codeword in a given row of the real buffer to different rows of the virtual buffer. As discussed previously, The FEC-encoder 106 maps a given codeword, for example the codeword 301 located in the row 308, in the real buffer 202 to different row, for example, rows 310, 312, and 314 of the virtual buffer 204.

Figure 6:
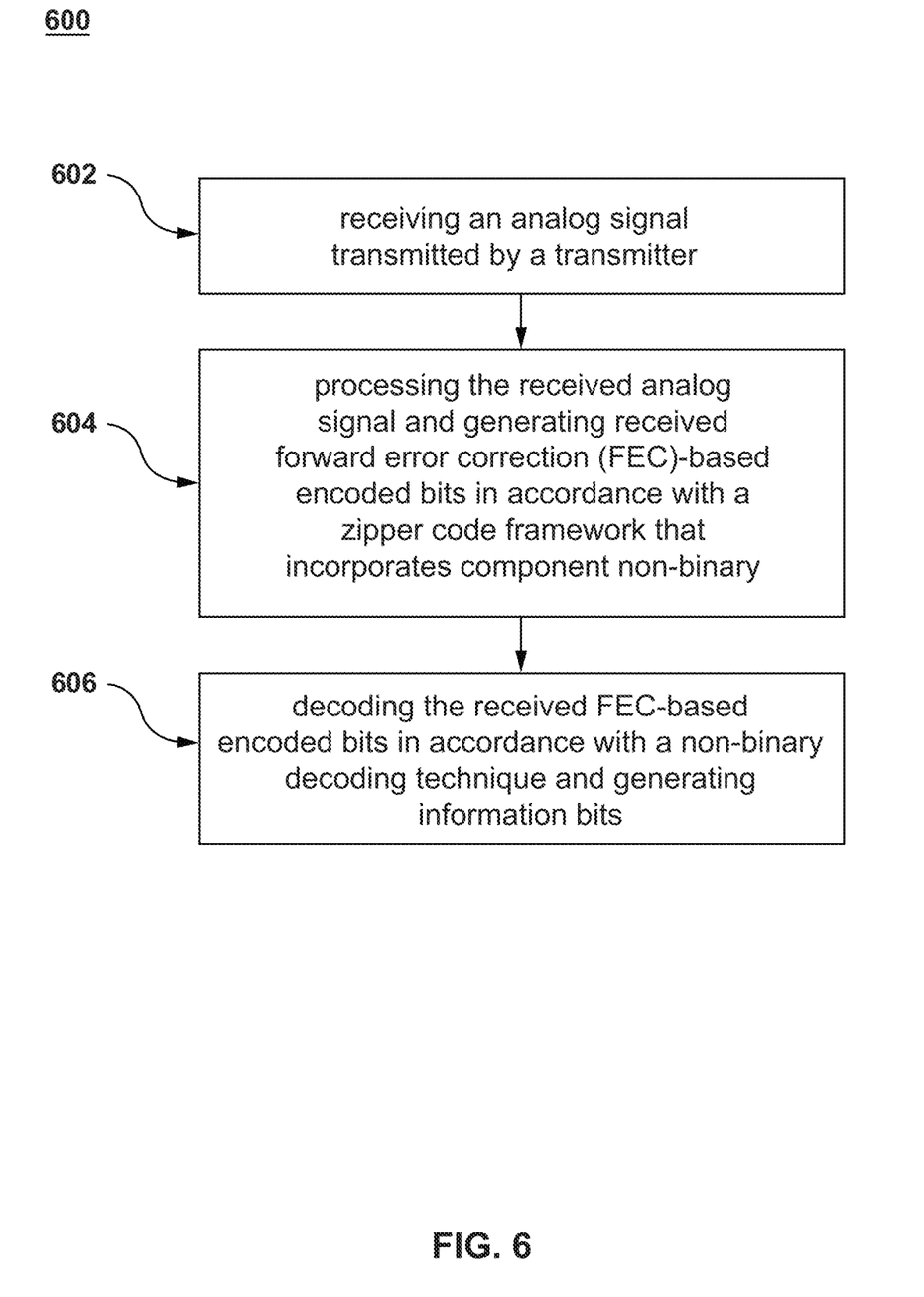
FIG. 6 illustrates a flowchart of a process implemented over the receiver, in accordance with various non-limiting embodiments of the present disclosure.

FIG. 6 illustrates a flowchart of a process 600 implemented over the receiver 118, in accordance with various non-limiting embodiments of the present disclosure. As shown, the process commences at step 602 where the receiver 118 receives an analog signal transmitted by the transmitter 602. As previously noted, the analog optical signal 120 may be received by the receiver 118 from the optical channel 116.

The process 600 advances to step 604 where receiver 118 processes the received analog signal and generating received forward error correction (FEC)-based encoded bits in accordance with a zipper code framework that incorporates component non-binary codes. As previously discussed, the demodulator 122 may demodulate the received analog optical signal 120 to a received digital signal. The post-equalizer 124 may equalize the received digital signal and may generate an equalized digital signal. The de-mapper 126 may translate the equalized digital signal back to a bit sequence, which manifests the FEC-based encoded bits in the transmitter 102. The FEC-based encoded bits are generated in accordance with the zipper code framework 200 that incorporates component non-binary codes such as RS codes.

Finally, at step 606, the receiver 606 decodes the received FEC-based encoded bits in accordance with a non-binary decoding technique and generating information bits. As discussed above, the FEC decoder 130 may perform decoding of the codewords in the receiver real buffer and the group of bits copied to the receiver virtual buffer in accordance with the non-binary decoding technique and generate information bits 132 manifesting information bits 104.

It is to be understood that the operations and functionality of the communication system 100, constituent components, and associated processes may be achieved by any one or more of hardware-based, software-based, and firmware-based elements. Such operational alternatives do not, in any way, limit the scope of the present disclosure.

It will also be understood that, although the embodiments presented herein have been described with reference to specific features and structures, it is clear that various modifications and combinations may be made without departing from such disclosures. The specification and drawings are, accordingly, to be regarded simply as an illustration of the discussed implementations or embodiments and their principles as defined by the appended claims, and are contemplated to cover any and all modifications, variations, combinations or equivalents that fall within the scope of the present disclosure.

What is claimed is:

1. A transmitter comprising:
   a forward error correction (FEC)-based encoder configured to:
      receive a plurality of data bits;
      generate FEC-based encoded data bits in accordance with a zipper code framework incorporating component non-binary codes, wherein:
         the zipper code framework includes a buffer having a virtual buffer and a real buffer, and
         the FEC-based encoder stores codewords associated with the FEC-based encoded data bits in rows of the real buffer; and
      map a given codeword in a given row of the real buffer to different rows of the virtual buffer in a quasi-diagonal interleaving manner, the mapping comprising:
         selecting at least a first group of bits from the given codeword stored in the given row of the real buffer and copying the first group of bits in a first row of the virtual buffer such that the first row of the virtual buffer is diagonally adjacent to the given row of the real buffer, and
         selecting at least a second group of bits from the given codeword stored in the given row of the real buffer and copying the second group of bits in a second row of the virtual buffer adjacent to the first row such that the second group of bits is diagonal to the first group of bits.

2. The transmitter of claim 1, wherein the non-binary codes are Reed-Solomon codes.

3. The transmitter of claim 1, wherein a length of the first group of bits is equal to a length of the second group of bits.

4. The transmitter of claim 1, wherein the first group of bits belongs to a same non-binary code symbol.

5. The transmitter of claim 1, wherein the second group of bits belongs to a same non-binary code symbol.

6. The transmitter of claim 1 further comprising a transmitter processor configured to:
   process the FEC-based encoded data bits and generate an analog signal; and
   transmit the analog signal to a communication channel.

7. A receiver comprising:
   a receiver processor configured to:
      receive an analog signal transmitted by a transmitter, and
      process the received analog signal and generate received forward error correction (FEC)-based encoded bits in accordance with a zipper code framework that incorporates component non-binary codes; and
   a FEC-based decoder configured to decode the received FEC-based encoded bits in accordance with a non-binary decoding technique, store codewords associated with the received FEC-based encoded bits in rows of a real buffer associated with the zipper code framework, and generate information bits.

8. The receiver of claim 7, wherein the non-binary codes are Reed-Solomon codes.

9. The receiver of claim 7, wherein the FEC-based decoder is further configured to:
   select at least a first group of bits from a given codeword stored in a given row of the real buffer and copy the first group of bits in a first row of a virtual buffer associated with the zipper code framework such that the first row of the virtual buffer is diagonally adjacent to the given row of the real buffer; and
   select at least a second group of bits from the given codeword stored in the given row of the real buffer and copy the second group of bits in a second row of the virtual buffer adjacent to the first row such that the second group of bits is diagonal to the first group of bits.

10. The receiver of claim 9, wherein the FEC-based decoder is further configured to select the first group of bits and the second group of bits in accordance with an interleaver map.

11. The receiver of claim 7 further comprising a de-mapper configured to compute absolute values of log-likelihood ratios (LLRs) from the received FEC-based encoded bits.

12. The receiver of claim 11, wherein the FEC-based decoder is further configured to:
 determine erasure bits in the received FEC-based encoded bits based on the absolute values of LLRs less than a predefined threshold;
 determine reliable bits in the received FEC-based encoded bits based on the absolute values of LLRs more than the predefined threshold; and
 decode a given codeword associated with the received FEC-based encoded bits by one or more of:
  marking symbols with erasure bits in the given codeword associated with the received FEC-based encoded bits as erased symbols and decoding the given codeword using error-and-erasure,
  decoding the given codeword based on the absolute values of LLRs associated with the FEC-based encoded bits, and
  flipping the erasure bits and decoding the given codeword using the flipped erasure bits and the reliable bits.

13. The receiver of claim 12, wherein the FEC-based decoder is further configured to:
 determine if more than one valid codeword is decoded corresponding to the given codeword, and
  in the event that more than one valid codeword is decoded, select the codeword in which the least number of reliable bits are flipped and remove erasure markings for remaining iterations of decoding.

14. The receiver of claim 12, wherein the FEC-based decoder is further configured to:
 determine if only one valid codeword is decoded corresponding to the given codeword, and
  in the event that only one valid codeword is decoded, remove erasure markings for remaining iterations of decoding.

15. The receiver of claim 12, wherein the FEC-based decoder is further configured to:
 determine if no valid codeword is decoded corresponding to the given codeword, and
  in the event that no valid codeword is decoded, perform no decoding operation on the given codeword.

16. A method of transmission comprising:
 receiving a plurality of data bits;
 generating FEC-based encoded data bits in accordance with a zipper code framework incorporating component non-binary codes, wherein the zipper code framework includes a buffer having a virtual buffer and a real buffer;
 storing codewords associated with the FEC-based encoded data bits in rows of the real buffer; and
 mapping a given codeword in a given row of the real buffer to different rows of the virtual buffer in a quasi-diagonal interleaving manner, the mapping comprising:
  selecting at least a first group of bits from the given codeword stored in the given row of the real buffer and copying the first group of bits in a first row of the virtual buffer such that the first row of the virtual buffer is diagonally adjacent to the given row of the real buffer, and
  selecting at least a second group of bits from the given codeword stored in the given row of the real buffer and copying the second group of bits in a second row of the virtual buffer adjacent to the first row such that the second group of bits is diagonal to the first group of bits.

17. The method of claim 16, wherein the non-binary codes are Reed-Solomon codes.

18. The method of claim 16, wherein a length of the first group of bits is equal to a length of the second group of bits.

19. The method of claim 16, wherein the first group of bits belongs to a same non-binary code symbol.

20. The method of claim 16, wherein the second group of bits belongs to a same non-binary code symbol.

21. The method of claim 16 further comprising:
 processing the FEC-based encoded data bits and generating an analog signal; and
 transmitting the analog signal to a communication channel.

22. A method for reception comprising:
 receiving an analog signal transmitted by a transmitter;
 processing the received analog signal and generating received forward error correction (FEC)-based encoded bits in accordance with a zipper code framework that incorporates component non-binary codes; and
 decoding the received FEC-based encoded bits in accordance with a non-binary decoding technique and generating information bits, wherein the decoding comprises storing codewords associated with the received FEC-based encoded bits in rows of a real buffer associated with the zipper code framework.

23. The method of claim 22, wherein the non-binary codes are Reed-Solomon codes.

24. The method of claim 22 further comprising:
 selecting at least a first group of bits from a given codeword stored in a given row of the real buffer and copying the first group of bits in a first row of a virtual buffer associated with the zipper code framework such that the first row of the virtual buffer is diagonally adjacent to the given row of the real buffer; and
 selecting at least a second group of bits from the given codeword stored in the given row of the real buffer and copying the second group of bits in a second row of the virtual buffer adjacent to the first row such that the second group of bits is diagonal to the first group of bits.

25. The method of claim 24 further comprising selecting the first group of bits and the second group of bits in accordance with an interleaver map.

26. The method of claim 22 further comprising computing absolute values of log-likelihood ratios (LLRs) from the received FEC-based encoded bits.

27. The method of claim 26 further comprising:
 determining erasure bits in the received FEC-based encoded bits based on the absolute values of LLRs less than a predefined threshold;
 determining reliable bits in the received FEC-based encoded bits based on the absolute values of LLRs more than the predefined threshold; and
 decoding a given codeword associated with the received FEC-based encoded bits by one or more of:
  marking symbols with erasure bits in the given codeword associated with the received FEC-based encoded bits as erased symbols and decoding the given codeword using error-and-erasure,
  decoding the given codeword based on the absolute values of LLRs associated with the FEC-based encoded bits, and flipping the erasure bits and decoding the given codeword using the flipped erasure bits and the reliable bits.

28. The method of claim 27 further comprising:
determining if more than one valid codeword is decoded corresponding to the given codeword, and
in the event that more than one valid codeword is decoded, selecting the codeword in which the least number of reliable bits are flipped and removing erasure markings for remaining iterations of decoding.

29. The method of claim 27 further comprising:
determining if only one valid codeword is decoded corresponding to the given codeword, and
in the event that only one valid codeword is decoded, removing erasure markings for remaining iterations of decoding.

30. The method of claim 27 further comprising:
determining if no valid codeword is decoded corresponding to the given codeword, and
in the event that no valid codeword is decoded, performing no decoding operation on the given codeword.

* * * * *